United States Patent
Abiru (10) Patent No.: US 8,309,373 B2
(45) Date of Patent: Nov. 13, 2012

(54) METHOD OF MANUFACTURING SEMICONDUCTOR DEVICE

(75) Inventor: Takahisa Abiru, Kumamoto (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 313 days.

(21) Appl. No.: 12/591,934

(22) Filed: Dec. 4, 2009

(65) Prior Publication Data
US 2010/0167432 A1    Jul. 1, 2010

(30) Foreign Application Priority Data

Dec. 26, 2008   (JP) ................................ 2008-333051

(51) Int. Cl.
*H01L 21/66* (2006.01)

(52) U.S. Cl. .................. 438/18; 438/613; 257/E21.231
(58) Field of Classification Search ............ 438/17, 438/18, 761, 612, 613
See application file for complete search history.

(56) References Cited

U.S. PATENT DOCUMENTS

| | | | |
|---|---|---|---|
| 6,204,074 B1* | 3/2001 | Bertolet et al. ................. | 438/18 |
| 6,753,609 B2* | 6/2004 | Chien et al. .................... | 257/761 |
| 6,881,654 B2* | 4/2005 | Chen et al. ..................... | 438/497 |
| 7,399,698 B2* | 7/2008 | Bae ................................ | 438/624 |
| 7,528,001 B2* | 5/2009 | Kim ................................ | 438/69 |
| 7,772,106 B2* | 8/2010 | Lin et al. ........................ | 438/614 |
| 7,785,914 B2* | 8/2010 | Kim ................................ | 438/60 |
| 7,901,956 B2* | 3/2011 | Kuan et al. ..................... | 438/17 |
| 2006/0164110 A1 | 7/2006 | Miyazaki et al. | |
| 2007/0224798 A1 | 9/2007 | Miyazaki et al. | |
| 2007/0228561 A1* | 10/2007 | Matsuki et al. ............... | 257/737 |
| 2009/0243118 A1* | 10/2009 | Akiba et al. ................... | 257/773 |

FOREIGN PATENT DOCUMENTS

| | | |
|---|---|---|
| JP | 7-201866 | 8/1995 |
| JP | 2001-127256 | 5/2001 |
| JP | 2002-90422 | 3/2002 |
| JP | 2006-210438 | 8/2006 |

* cited by examiner

*Primary Examiner* — Savitr Mulpuri
(74) *Attorney, Agent, or Firm* — McGinn IP Law Group, PLLC (57) ABSTRACT

A method of manufacturing a semiconductor device includes: forming a first pad and a second pad over a substrate; forming a first insulating film over the second pad without forming the first insulating film over the first pad; forming a metal film over the first pad and the second pad; forming an electrode over the first pad with the metal film interposed therebetween; selectively removing the metal film over the second pad; and removing the first insulating film over the second pad.

16 Claims, 7 Drawing Sheets

METHOD OF MANUFACTURING SEMICONDUCTOR DEVICE

This application is based on Japanese patent application No. 2008-333051, the content of which is incorporated hereinto by reference.

BACKGROUND

1. Technical Field

The present invention relates to a method of manufacturing a semiconductor device.

2. Related Art

Semiconductor devices have been proposed in which a test pad and a bump electrode pad having a bump electrode formed thereon are formed on a substrate (Japanese Patent Application Laid-Open (JP-A) Nos. 2001-127256, 2002-90422, 2006-210438, and 7-201886).

In the semiconductor devices, it is possible to contact a probe of a test device with the test pad to measure the characteristics of the semiconductor device. When the probe comes into direct contact with the bump electrode, the bump electrode is deformed, which causes a connection error to other electronic apparatuses. When the test pad is formed, it is possible to solve the above issue.

Figure 8:
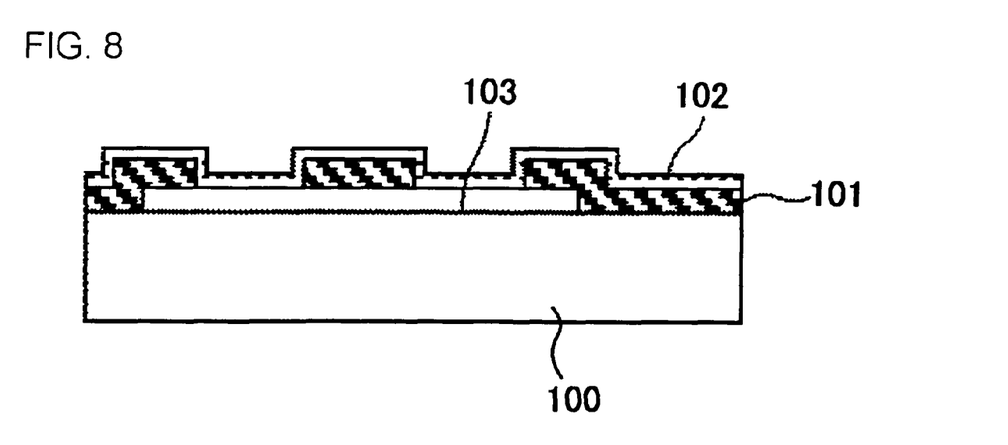
FIG. 8 is a cross-sectional view illustrating a process of manufacturing a semiconductor device according to the related art.
Figure 9:
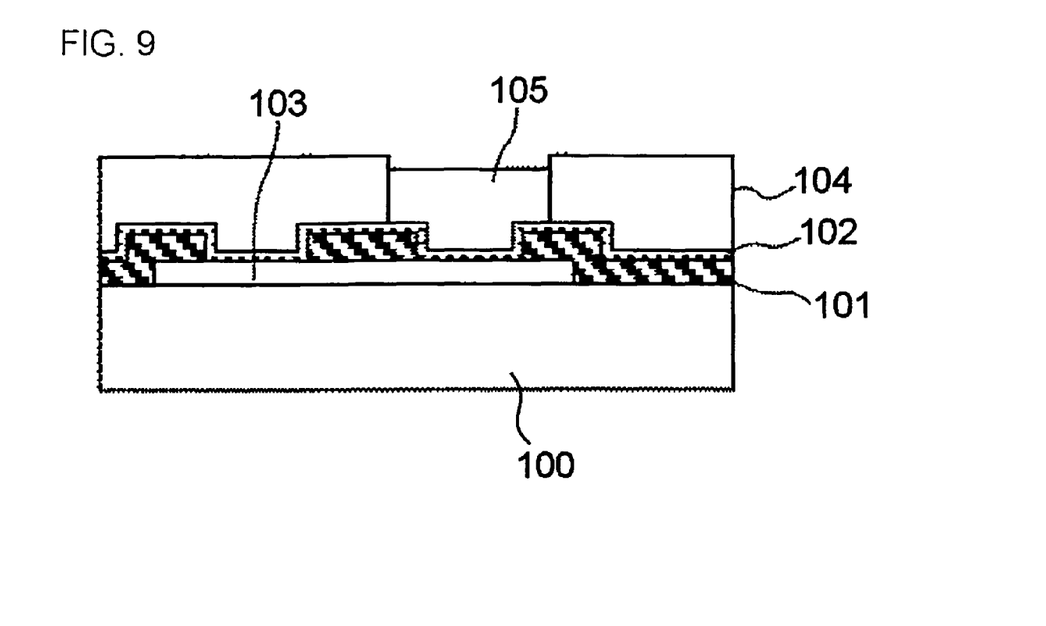
FIG. 9 is a cross-sectional view illustrating the process of manufacturing the semiconductor device according to the related art.
Figure 10:
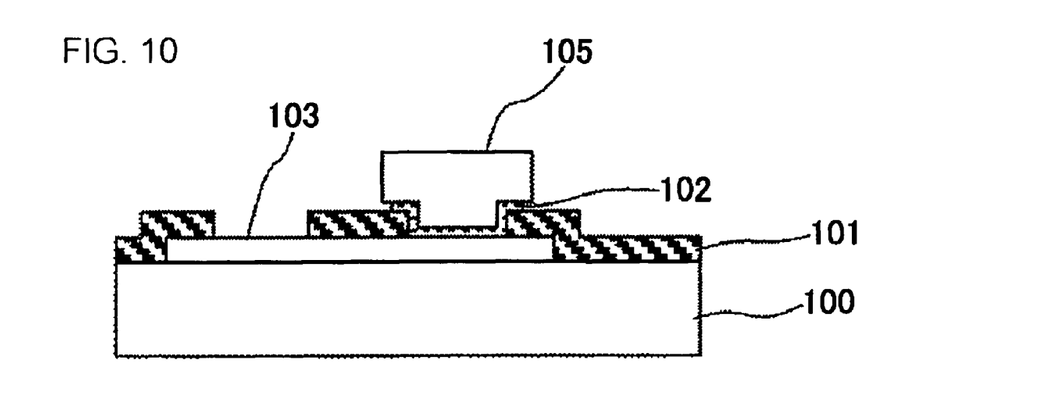
FIG. 10 is a cross-sectional view illustrating the process of manufacturing the semiconductor device according to the related art.
Figure 11:
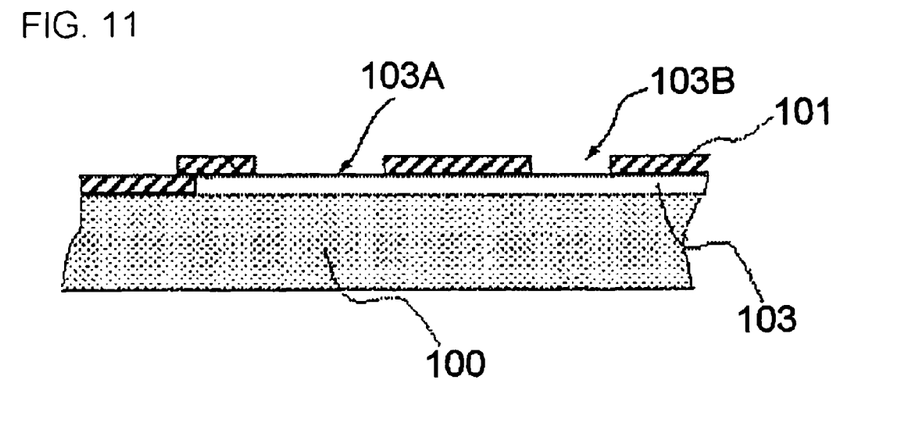
FIG. 11 is a cross-sectional view illustrating the process of manufacturing the semiconductor device according to the related art.
Figure 12:
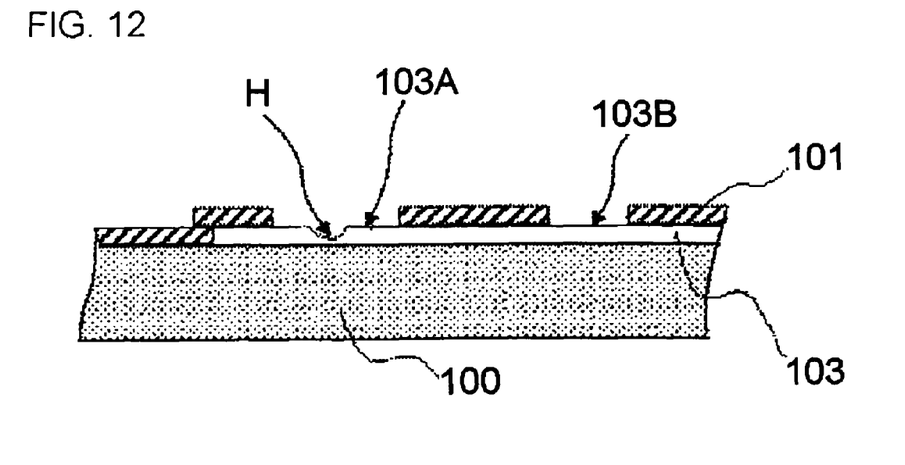
FIG. 12 is a cross-sectional view illustrating the process of manufacturing the semiconductor device according to the related art.

As shown in FIGS. 8 to 10, the semiconductor device is manufactured by, for example, the following method.

As shown in FIG. 8, an uppermost interconnect layer 103 is formed on a substrate 100, and a first passivation film 101 is formed on the uppermost interconnect layer 103. Then, openings are formed in the first passivation film 101. A portion (a probe contact region and a bonding region) of the uppermost interconnect layer 103 is exposed through the openings.

Then, a barrier metal film 102 is formed, and a resist 104 is provided to form a bump 105 on the bonding region, as shown in FIG. 9.

Then, as shown in FIG. 10, the barrier metal film 102 on the probe contact region is removed (see JP-A No. 2006-210438).

In addition, the following manufacturing method has been proposed. The manufacturing method will be described with reference to FIGS. 11 to 14.

An uppermost interconnect layer 103 is formed on a substrate 100, and a first passivation film 101 is formed on the uppermost interconnect layer 103. Then, openings are formed in the first passivation film 101 (see FIG. 11). Then, a probe comes into contact with a probe contact region 103A of the uppermost interconnect layer 103 exposed through the opening of the first passivation film 101 to perform a test (see FIG. 12). In this case, a probe contact mark H is formed in the probe contact region 103A.

Figure 13:
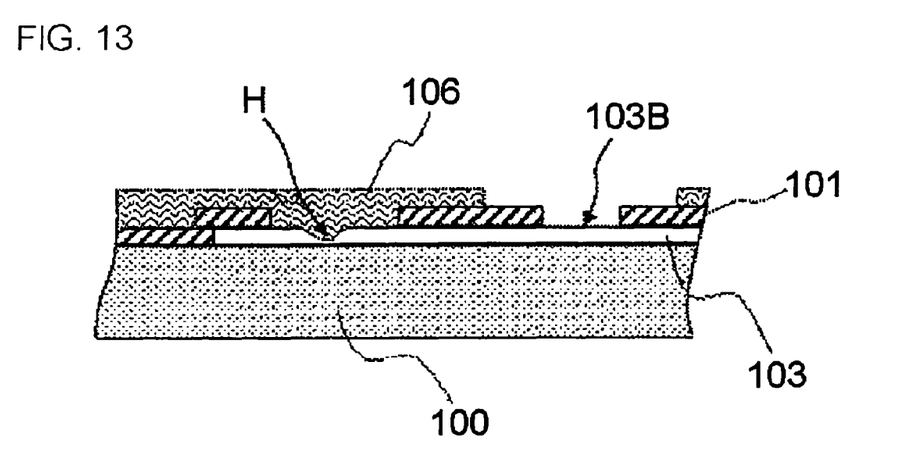
FIG. 13 is a cross-sectional view illustrating the process of manufacturing the semiconductor device according to the related art.
Figure 14:
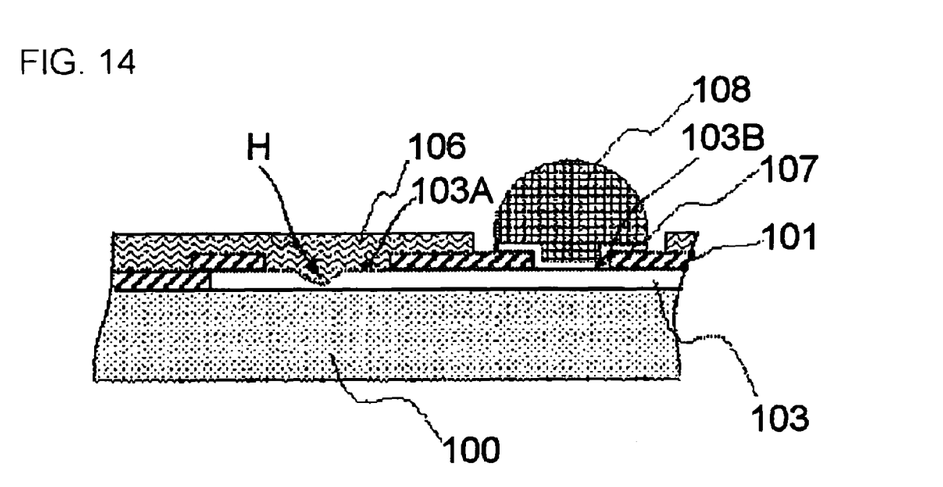
FIG. 14 is a cross-sectional view illustrating the process of manufacturing the semiconductor device according to the related art.

Then, as shown in FIG. 13, a second passivation film 106 is formed and the second passivation film 106 on a bonding region 103B is removed. Then, as shown in FIG. 14, a barrier metal 107 is formed and the barrier metal 107 in regions other than the bonding region 103B is removed. Then, a bump 108 is formed on the bonding region 103B (see JP-A No. 2006-210438).

The present inventor has recognized as follows. In the method disclosed in JP-A No. 2006-210438, when the barrier metal film 102 on the probe contact region 103A of the uppermost interconnect layer 103 is completely removed, the uppermost interconnect layer 103 is also etched, which makes it difficult to normally perform a test.

In the method disclosed in JP-A No. 2006-210438, finally, the probe contact region 103A is covered with the second passivation film 106. Therefore, only before the second passivation film 106 is formed, a test can be performed. However, it is difficult to perform the test after the semiconductor device is manufactured. In the semiconductor device disclosed in JP-A No. 2006-210438, an essential structure is to cover the probe contact region 103A with the second passivation film 106.

SUMMARY

In one embodiment, there is provided a method of manufacturing a semiconductor device. The method includes: forming a first pad and a second pad over a substrate; forming a first insulating film over the second pad without forming the first insulating film over the first pad; forming a metal film over the first pad and the second pad; forming an electrode over the first pad with the metal film interposed therebetween; selectively removing the metal film over the second pad; and removing the first insulating film over the second pad.

According to the above embodiment of the invention, the metal film is formed over the first pad and the second pad with the first insulating film formed on the second pad.

Then, the metal film over the second pad is removed. During the removal of the metal film, since there is the first insulating film between the metal film and the second pad, the second pad is protected. Therefore, the second pad is not affected by the removal of the metal film. In this way, it is possible to stably test a semiconductor device and thus obtain a semiconductor device with high reliability.

In addition, during the removal of the metal film, since an electrode is formed over the first pad, the first pad is not affected by the removal of the metal film. In this way, it is possible to improve the reliability of a semiconductor device.

In the above embodiment of the invention, since the first insulating film on the second pad is removed, it is possible to stably test the characteristics of a semiconductor device using the second pad after the semiconductor device is assembled.

According to the above embodiment of the invention, it is possible to provide a method of manufacturing a semiconductor device that can be stably tested after an electrode is formed and has high reliability.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings.

An embodiment of the invention will be described with reference to FIGS. 1 to 7.

First, the outline of this embodiment will be described.

A method of manufacturing a semiconductor device according to this embodiment includes: forming a first pad 12 and a second pad 13 over a substrate 11; forming a first insulating film 15 over the second pad 13 without forming the first insulating film 15 over the first pad 12; forming a metal film 16 over the first pad 12 and the second pad 13; forming an electrode 17 over the first pad 12 with the metal film 16 interposed therebetween; selectively removing the metal film 16 over the second pad 13; and removing the first insulating film 15 over the second pad 13.

Next, a method of manufacturing a semiconductor device 1 according to this embodiment will be described in detail with reference to FIGS. 1 to 7.

Figure 1:
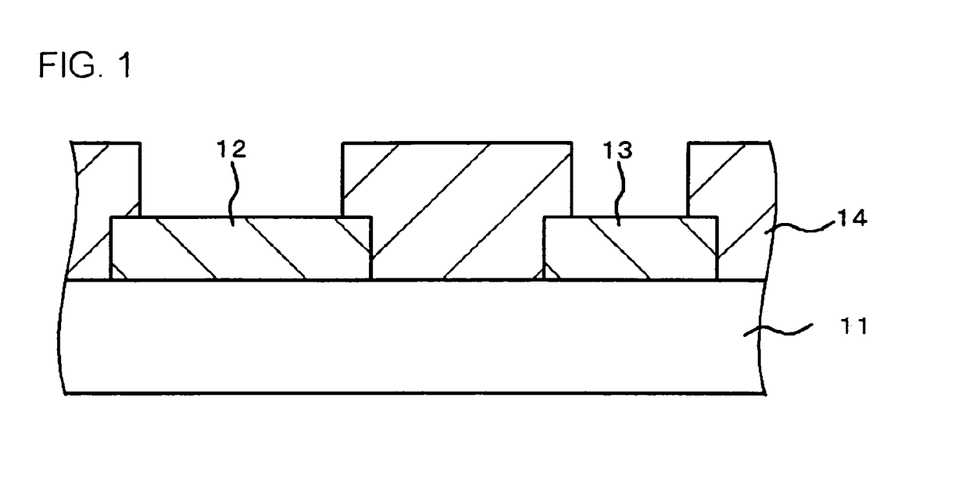
FIG. 1 is a cross-sectional view illustrating a process of manufacturing a semiconductor device according to an embodiment of the invention.

First, as shown in FIG. 1, a substrate 11 is prepared. Although not shown in the drawings, the substrate 11 includes a semiconductor substrate serving as a base, an insulating layer formed on the semiconductor substrate, and interconnects formed in the insulating layer.

A first pad 12 and a second pad 13 are formed on the substrate 11. Specifically, although not shown in the drawings, a metal layer is formed so as to cover the surface of the substrate 11, and a mask in which regions other than the regions for the first pad 12 and the second pad 13 are opened is formed on the metal layer. Then, plasma etching is performed to selectively remove the metal layer exposed through the openings of the mask. Then, the mask is removed.

Both the first pad 12 and the second pad 13 are made of a metal material (for example, aluminum films).

Then, an insulating film (second insulating film 14) is formed on the substrate 11. The insulating film 14 is a passivation film, such as a SiN film or a polyimide film. Then, openings are formed in the insulating film 14 to expose the surface of the first pad 12 and the surface of the second pad 13 (see FIG. 1).

Figure 2:
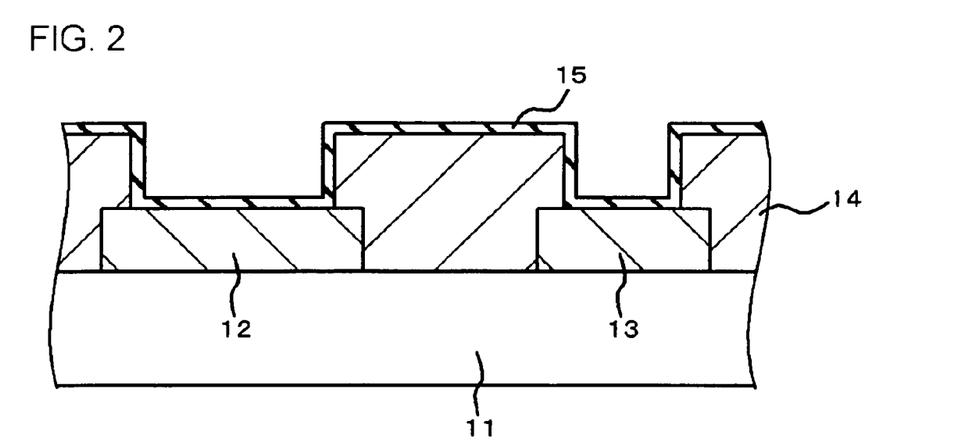
FIG. 2 is a cross-sectional view illustrating the process of manufacturing the semiconductor device.

Then, as shown in FIG. 2, an insulating film (first insulating film) 15 is formed over the substrate 11. The insulating film 15 covers the insulating film 14, the surface of the first pad 12 exposed from the insulating film 14, and the surface of the second pad 13 exposed from the insulating film 14. It is preferable that the etching rate of plasma etching, which will be described below, of the insulating film 15 be higher than that of the insulating film 14 and be greatly different from that of the insulating film 14. For example, a $SiO_2$ film may be used as the insulating film 15.

The insulating film 15 comes into direct contact with the surface of the first pad 12 and the surface of the second pad 13.

Figure 3:
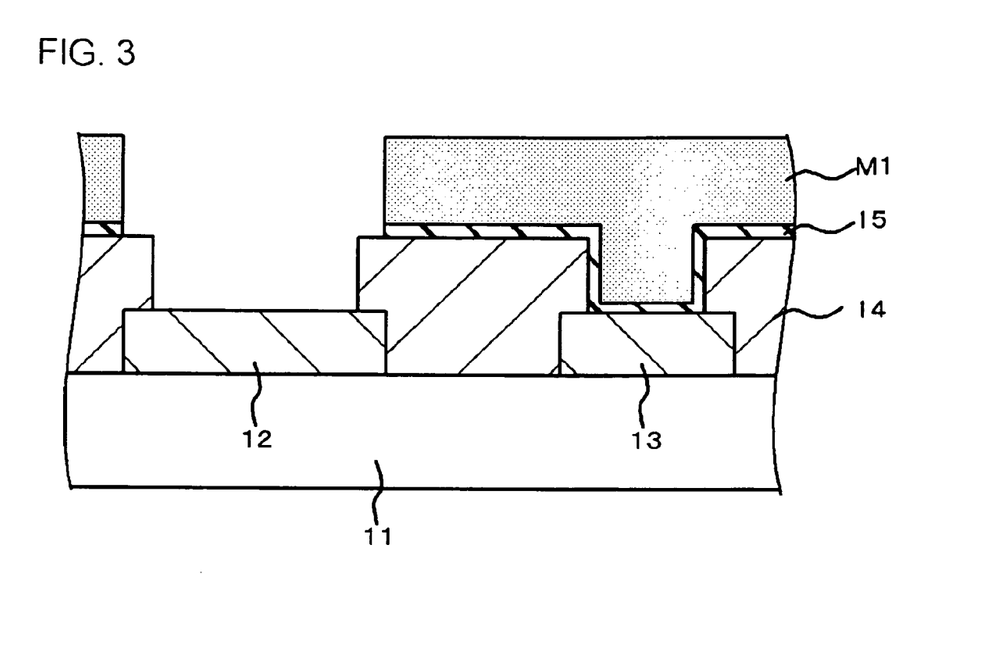
FIG. 3 is a cross-sectional view illustrating the process of manufacturing the semiconductor device.

Then, as shown in FIG. 3, a mask M1 is formed on the insulating film 15. The mask M1 is a photoresist film and has an opening at a position corresponding to the surface of the first pad 12. The insulating film 15 exposed from the opening of the mask M1 is selectively removed to expose the surface of the first pad 12. In this case, for example, plasma etching is performed to selectively remove the insulating film 15. In this embodiment, a portion of the insulating film 15 covering the inside of the opening which is formed in the insulating film 14 so as to expose the surface of the first pad 12 and another portion of the insulating film 15 disposed at the edge of the opening are selectively removed. In addition, the insulating film 15 remains on the second pad 13.

Figure 4:
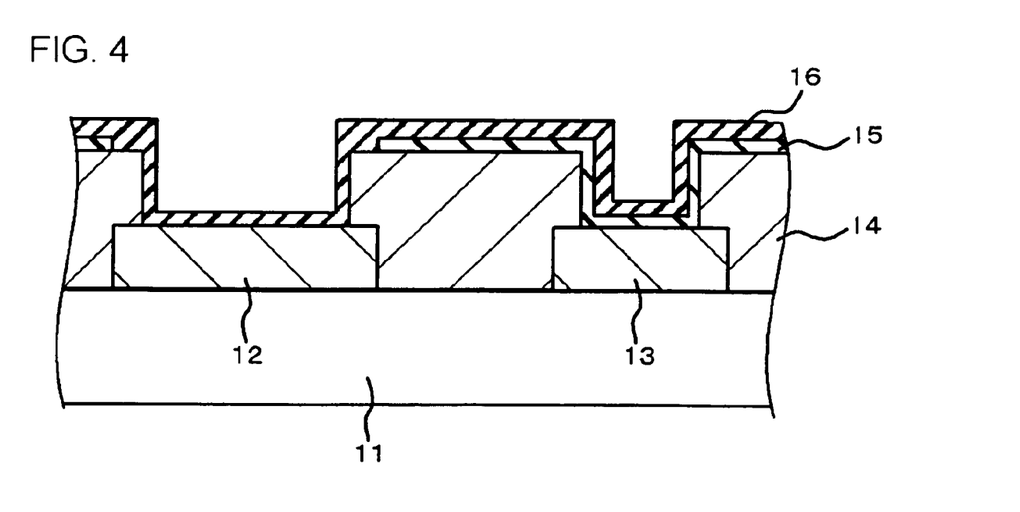
FIG. 4 is a cross-sectional view illustrating the process of manufacturing the semiconductor device.

Then, the mask M1 is removed and a metal film 16 is formed as shown in FIG. 4. The metal film 16 is formed by a sputtering method and covers the surface of the insulating film 15, the surface of the first pad 12, and the inner surface of the opening of the insulating film 15 through which the first pad 12 is exposed. The metal film 16 includes; for example, a barrier film and a seed film that is formed on the barrier film in order to form a bump 17. For example, a metal film, such as a Ti film or a TiN film, is used as the barrier film. The seed film is made of the same metal material as that forming the bump 17. For example, the seed film is made of gold.

Figure 5:
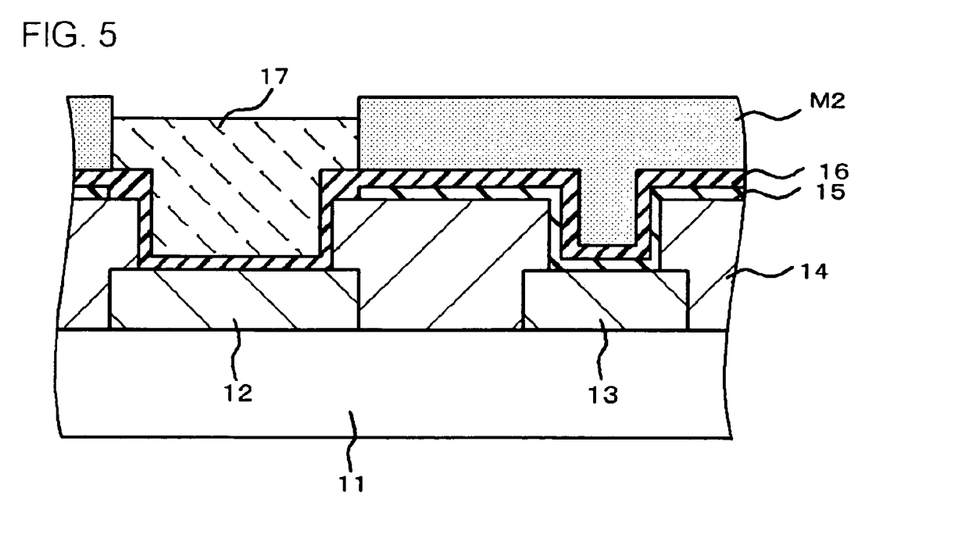
FIG. 5 is a cross-sectional view illustrating the process of manufacturing the semiconductor device.

Then, as shown in FIG. 5, a mask M2 is formed on the metal film 16. The mask M2 is a photoresist. The mask M2 is formed so as to expose a portion of the metal film 16 covering the inside of the opening that is formed in the insulating film 14 to expose the first pad 12 and another portion of the metal film 16 covering the edge of the opening and to cover other portions of the metal film.

Then, the bump 17, serving as a protruding electrode, is formed in the opening of the mask M2, that is, over the first pad 12. The bump 17 may be formed by, for example, a plating method, and the bump 17 is made of, for example, solder, copper, or gold. The bump 17 fills up the opening that is formed in the insulating film 14 to expose the first pad 12, and covers the edge of the opening protruding from the opening.

Figure 6:
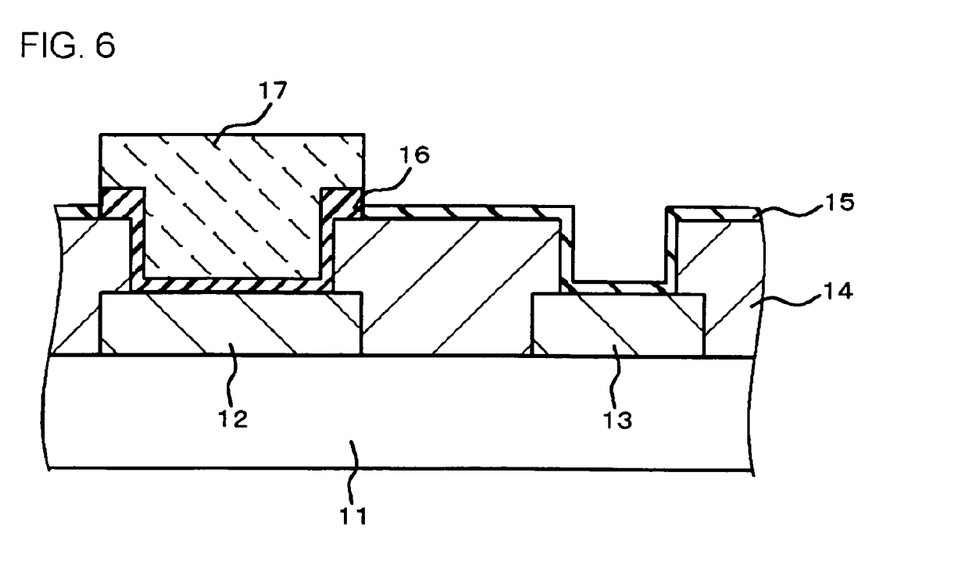
FIG. 6 is a cross-sectional view illustrating the process of manufacturing the semiconductor device.

Then, as shown in FIG. 6, the mask M2 is removed. The metal film 16 in regions other than the region on which the bump 17 is formed, specifically, the metal film 16 on the insulating film 15 and the second pad 13 are selectively removed by etching.

Wet etching is performed as a method of removing the metal film 16. In this case, since the bump 17 is formed over the first pad 12, it is possible to prevent the first pad 12 from being etched. In addition, since the insulating film 15 is formed on the second pad 13, it is possible to prevent the second pad 13 from being etched.

Figure 7:
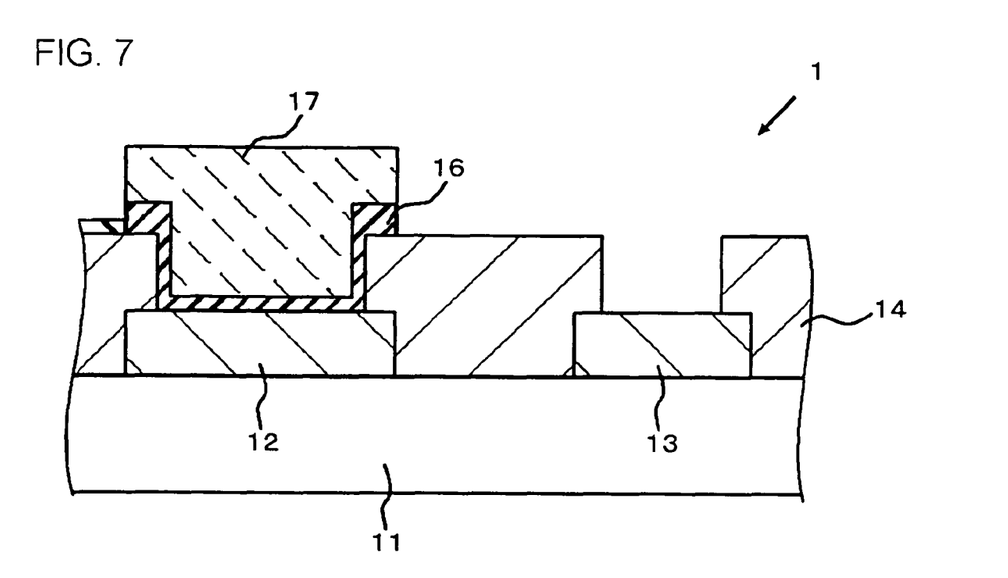
FIG. 7 is a cross-sectional view illustrating the process of manufacturing the semiconductor device.

Then, as shown in FIG. 7, the insulating film 15 on the second pad 13 is removed. In this case, the insulating film 15 is removed by anisotropic etching, for example, a plasma etching method.

In this way, the semiconductor device 1 is obtained.

Then, the semiconductor device 1 is tested. A probe of a test device comes into contact with the second pad. 13 to test the characteristics of the semiconductor device 1. The second pad 13 is a test pad. In this embodiment, a test operation of contacting the probe of the test device with the second pad 13 to test the characteristics of the semiconductor device 1 is not performed before the insulating film 15 is formed.

Next, the effects and operations of this embodiment will be described.

In this embodiment, the metal film 16 is formed over the first pad 12 and the second pad 13 with the insulating film 15 remaining on the second pad 13.

Then, the metal film 16 over the second pad 13 is removed. During the removal of the metal film 16, since there is the insulating film 15 between the metal film 16 and the second pad 13, the second pad 13 is protected. Therefore, the second pad 13 is not affected by the removal of the metal film. In this way, it is possible to stably test the semiconductor device 1 and thus obtain the semiconductor device 1 with high reliability.

In addition, during the removal of the metal film 16, since the bump 17 is formed over the first pad 12, the first pad 12 is not affected by the removal of the metal film 16. In this way, it is possible to improve the reliability of the semiconductor device 1.

In this embodiment, since the insulating film 15 on the second pad 13 is removed, it is possible to stably test the characteristics of the semiconductor device 1 using the second pad 13 after the semiconductor device 1 is assembled.

In this embodiment, the insulating film 15 is removed by plasma etching. Since the plasma etching is anisotropic etching, it is possible to prevent the insulating film 14 immediately below the bump 17 from being removed.

As described above, JP-A No. 2006-210438 discloses the structure in which the passivation film 106 is formed on the probe contact region 103A of the uppermost interconnect layer 103 and the barrier metal layer 107 is formed on the passivation film 106 and is then removed (FIGS. 11 to 14).

In JP-A No. 2006-210438, the passivation film 106 is formed on the probe contact region 103A of the uppermost interconnect layer 103 for the following reason. When a test is performed with the probe, it is necessary to protect the probe contact region 103A since the probe contact region 103A becomes thin. In addition, when a test is performed with the probe, the passivation film 106 may prevent chips generated from the probe contact region 103A from being moved to the outside.

Therefore, in JP-A No. 2006-210438, it is premised that a test is performed with the probe before the passivation film 106 is formed. In JP-A No. 2006-210438, if the test is not performed before the passivation film 106 is formed, it is impossible to assume the step of forming the passivation film 106.

In contrast, in this embodiment, the insulating film 15 is provided in order to protect the second pad 13 from etching when the metal film is removed although a test is not performed with the probe before the insulating film 15 is formed. Therefore, the manufacturing method according to this embodiment is greatly different from the method of manufacturing the semiconductor device 1 disclosed in JP-A No. 2006-210438 in the above points in addition to the points described in the RELATED ART of the invention.

The invention is not limited to the above-described embodiment, but various modifications and changes of the invention can be made without departing from the scope and spirit of the invention.

In the above-described embodiment, the first pad 12 is not connected to the second pad 13, but the invention is not limited thereto. For example, the first pad and the second pad may be connected to each other.

In the above-described embodiment, after the first insulating film 15 is formed on the first pad 12 and the second pad 13, the first insulating film 15 on the first pad 12 is selectively removed. However, the invention is not limited thereto. For example, the first insulating film 15 may be formed only on the second pad 13.

It is apparent that the present invention is not limited to the above embodiments, and may be modified and changed without departing from the scope and spirit of the invention.

What is claimed is:

1. A method of manufacturing a semiconductor device, comprising:
   forming a first pad and a second pad over a substrate;
   forming a first insulating film over said second pad without forming the first insulating film over said first pad;
   forming a metal film over said first pad and said second pad;
   forming an electrode over said first pad with said metal film interposed therebetween;
   selectively removing said metal film over said second pad; and
   removing said first insulating film over said second pad,
   wherein said without forming the first insulating film over said first pad comprises covering no portion of said first pad by the first insulating film; and
   contacting a probe of a test device with said second pad to test the semiconductor device after said removing said first insulating film over said second pad.

2. The method of manufacturing a semiconductor device according to claim 1, further comprising:
   forming a second insulating film so as to cover said first pad and said second pad after said first pad and said second pad are formed over said substrate; and
   selectively removing said second insulating film to form openings through which the surface of said first pad and the surface of said second pad are exposed,
   wherein said forming the first insulating film over said second pad without forming the first insulating film over the first pad is performed after said forming the openings in said second insulating film, and
   in said removing said first insulating film over said second pad, said first insulating film is removed by plasma etching.

3. The method of manufacturing a semiconductor device according to claim 1, wherein said second pad comprises a test pad that is used to test the semiconductor device.

4. The method of manufacturing a semiconductor device according to claim 1, wherein, in said forming the metal film over said first pad and said second pad, said metal film is formed by a sputtering method.

5. The method of manufacturing a semiconductor device according to claim 1, wherein said forming said first pad and said second pad over said substrate comprises forming said first pad and said second pad above said substrate.

6. The method of manufacturing a semiconductor device according to claim 1, wherein said first pad and said second pad both comprise a metal material.

7. The method of manufacturing a semiconductor device according to claim 1, wherein said metal film comprises:
   a barrier film, and a seed film that is formed on the barrier film in order to form a bump.

8. The method of manufacturing a semiconductor device according to claim 7, wherein said seed film comprises the same metal material as that forming the bump.

9. The method of manufacturing a semiconductor device according to claim 1, wherein said selectively removing said metal film comprises an etching.

10. The method of manufacturing a semiconductor device according to claim 9, wherein said etching comprises a wet etching.

11. The method of manufacturing a semiconductor device according to claim 1, wherein the first pad and the second pad are formed above a top surface of the substrate.

12. The method of manufacturing a semiconductor device according to claim 2, wherein an etching rate of the first insulating film is higher than an etching rate of the second insulating film.

13. The method of manufacturing a semiconductor device according to claim 12, wherein the etching rate of the first insulating film is different from the etching rate of the second insulating film.

14. The method of manufacturing a semiconductor device according to claim 7, wherein the bump is formed over the first pad.

15. A method of manufacturing a semiconductor device, comprising:
    forming a first pad and a second pad over a substrate;
    forming a first insulating film over said second pad without forming the first insulating film over said first pad;
    forming a metal film over said first pad and said second pad;
    forming an electrode over said first pad with said metal film interposed therebetween;
    selectively removing said metal film over said second pad;
    removing said first insulating film over said second pad; and
    contacting a probe of a test device with said second pad to test the semiconductor device after said removing said first insulating film over said second pad,
    wherein said contacting the probe of the test device with said second pad to test the semiconductor device is not performed before the first insulating film is formed.

16. The method of manufacturing a semiconductor device according to claim 1, wherein the first pad is not connected to the second pad.

* * * * *